(12) United States Patent
Raorane et al.

(10) Patent No.: US 9,397,079 B2
(45) Date of Patent: Jul. 19, 2016

(54) MULTICHIP INTEGRATION WITH THROUGH SILICON VIA (TSV) DIE EMBEDDED IN PACKAGE

(71) Applicant: INTEL CORPORATION, Santa Clara, CA (US)

(72) Inventors: Digvijay A. Raorane, Chandler, AZ (US); Yonggang Li, Chandler, AZ (US); Rahul N. Manepalli, Chandler, AZ (US); Javier Soto Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/636,016

(22) Filed: Mar. 2, 2015

(65) Prior Publication Data

US 2015/0171067 A1    Jun. 18, 2015

Related U.S. Application Data

(62) Division of application No. 13/893,216, filed on May 13, 2013, now Pat. No. 9,000,599.

(51) Int. Cl.
*H01L 25/00* (2006.01)
*H01L 23/00* (2006.01)
(Continued)

(52) U.S. Cl.
CPC ............ *H01L 25/50* (2013.01); *H01L 21/4846* (2013.01); *H01L 21/565* (2013.01);
(Continued)

(58) Field of Classification Search
CPC .................. H01L 2224/32145; H01L 25/50; H01L 24/83; H01L 25/0657; H01L 21/565; H01L 2224/40501; H01L 2924/01029; H01L 2224/8385
See application file for complete search history.

(56) References Cited

U.S. PATENT DOCUMENTS

| 8,344,503 B2 | 1/2013 | Sanders et al. |
| 2011/0018123 A1 | 1/2011 | An et al. |

(Continued)

FOREIGN PATENT DOCUMENTS

| JP | 2003243449 A | 8/2003 |
| JP | 2005-209689 | 8/2005 |

(Continued)

OTHER PUBLICATIONS

Office Action mailed Jul. 23, 2014, issued in corresponding U.S. Appl. No. 13/893,216, filed May 13, 2013, 6 pages.
(Continued)

*Primary Examiner* — Roy Potter
(74) *Attorney, Agent, or Firm* — Schwabe, Williamson & Wyatt, P.C.

(57) ABSTRACT

Embodiments of the present disclosure are directed to integrated circuit (IC) package assemblies with three-dimensional (3D) integration of multiple dies, as well as corresponding fabrication methods and systems incorporating such 3D IC package assemblies. A bumpless build-up layer (BBUL) package substrate may be formed on a first die, such as a microprocessor die. Laser radiation may be used to form an opening in a die backside film to expose TSV pads on the back side of the first die. A second die, such as a memory die stack, may be coupled to the first die by die interconnects formed between corresponding TSVs of the first and second dies. Underfill material may be applied to fill some or all of any remaining gap between the first and second dies, and/or an encapsulant may be applied over the second die and/or package substrate. Other embodiments may be described and/or claimed.

10 Claims, 11 Drawing Sheets

(51) Int. Cl.
  *H01L 23/498* (2006.01)
  *H01L 21/48* (2006.01)
  *H01L 23/538* (2006.01)
  *H01L 21/683* (2006.01)
  *H01L 23/522* (2006.01)
  *H01L 21/56* (2006.01)
  *H01L 25/065* (2006.01)
  *H01L 23/31* (2006.01)

(52) U.S. Cl.
  CPC ...... *H01L21/6835* (2013.01); *H01L 23/49816* (2013.01); *H01L 23/49822* (2013.01); *H01L 23/5226* (2013.01); *H01L 23/5389* (2013.01); *H01L 24/19* (2013.01); *H01L 24/80* (2013.01); *H01L 24/83* (2013.01); *H01L 24/92* (2013.01); *H01L 25/0657* (2013.01); *H01L 21/568* (2013.01); *H01L 23/3135* (2013.01); *H01L 2221/68372* (2013.01); *H01L 2221/68381* (2013.01); *H01L 2221/68386* (2013.01); *H01L 2224/0508* (2013.01); *H01L 2224/05111* (2013.01); *H01L 2224/05139* (2013.01); *H01L 2224/05144* (2013.01); *H01L 2224/05164* (2013.01); *H01L 2224/05169* (2013.01); *H01L 2224/05541* (2013.01); *H01L 2224/05568* (2013.01); *H01L 2224/05644* (2013.01); *H01L 2224/06181* (2013.01); *H01L 2224/12105* (2013.01); *H01L 2224/13005* (2013.01); *H01L 2224/13023* (2013.01); *H01L 2224/16146* (2013.01); *H01L 2224/73204* (2013.01); *H01L 2224/73259* (2013.01); *H01L 2224/8385* (2013.01); *H01L 2224/9222* (2013.01); *H01L 2225/06513* (2013.01); *H01L 2225/06524* (2013.01); *H01L 2225/06541* (2013.01); *H01L 2225/06548* (2013.01); *H01L 2225/06572* (2013.01); *H01L 2924/01029* (2013.01); *H01L 2924/181* (2013.01); *H01L 2924/18162* (2013.01); *H01L 2924/40501* (2013.01)

(56) References Cited

U.S. PATENT DOCUMENTS

| 2011/0057327 A1 | 3/2011 | Yoshida et al. |
| 2012/0074581 A1 | 3/2012 | Guzek et al. |

FOREIGN PATENT DOCUMENTS

| JP | 2008016624 A | 1/2008 |
| JP | 2009-110995 | 5/2009 |
| JP | 2011-061004 | 3/2011 |
| JP | 2012-080144 | 4/2012 |
| JP | 2013-080912 | 5/2013 |

OTHER PUBLICATIONS

Notice of Allowance mailed Dec. 16, 2014, issued in corresponding U.S. Appl. No. 13/893,216, filed May 13, 2013, 5 pages.
Non-Final Notification of Reason(s) for Refusal mailed Jul. 21, 2015 from Japanese Application No. 2014-088185, 3 pages.
Office Action mailed Apr. 5, 2016 for Japanese Application No. 2014-088185, 6 pages.

MULTICHIP INTEGRATION WITH THROUGH SILICON VIA (TSV) DIE EMBEDDED IN PACKAGE

RELATED APPLICATIONS

This application is a divisional of U.S. patent application Ser. No. 13/893,216, entitled "Multichip Integration with through Silicon via (Tsv) Die Embedded in Package," filed on May 13, 2013, which is hereby incorporated by reference in its entirety.

FIELD

Embodiments of the present disclosure generally relate to the field of integrated circuits, and more particularly, to techniques and configurations for enabling integrated circuit (IC) package assemblies with three-dimensional (3D) integration of multiple dies.

BACKGROUND

While form factors continue to shrink in size, consumer demand for faster processing speeds and increased memory capacity in mobile devices continues to rise. Recently, the IC industry has begun to practice three-dimensional (3D) integration of flip chip packages and peripheral devices using package-on-package (PoP) or direct die-to-die interconnection with through silicon vias (TSVs). However, currently available technologies do not provide for the use of thinner package substrates such as bumpless build-up layers in 3D integration schemes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
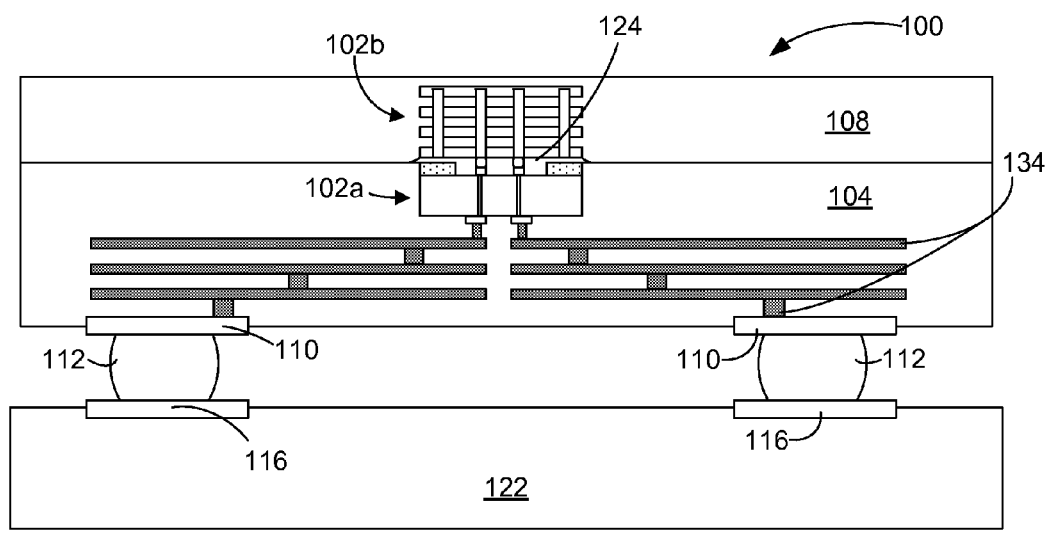
FIGS. 1a-1c illustrates a schematic cross-section side view of an example integrated circuit (IC) package assembly and portions thereof, in accordance with various embodiments.

Embodiments of the present disclosure describe techniques and configurations for 3D multichip integration in IC package assemblies. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout unless otherwise indicated, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1B:
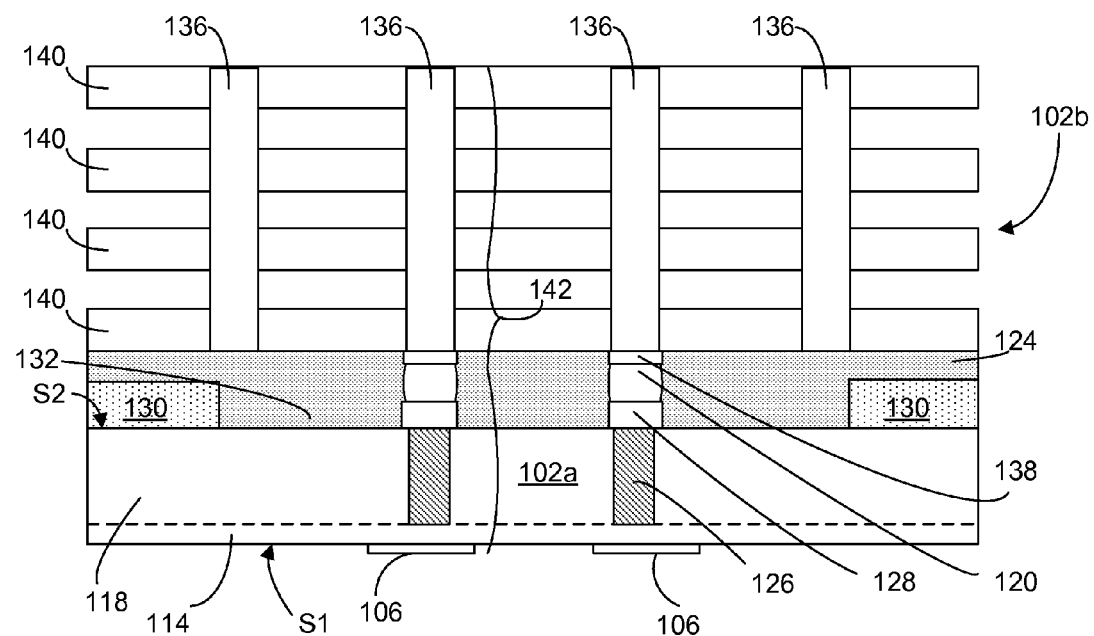
Figure 1C:
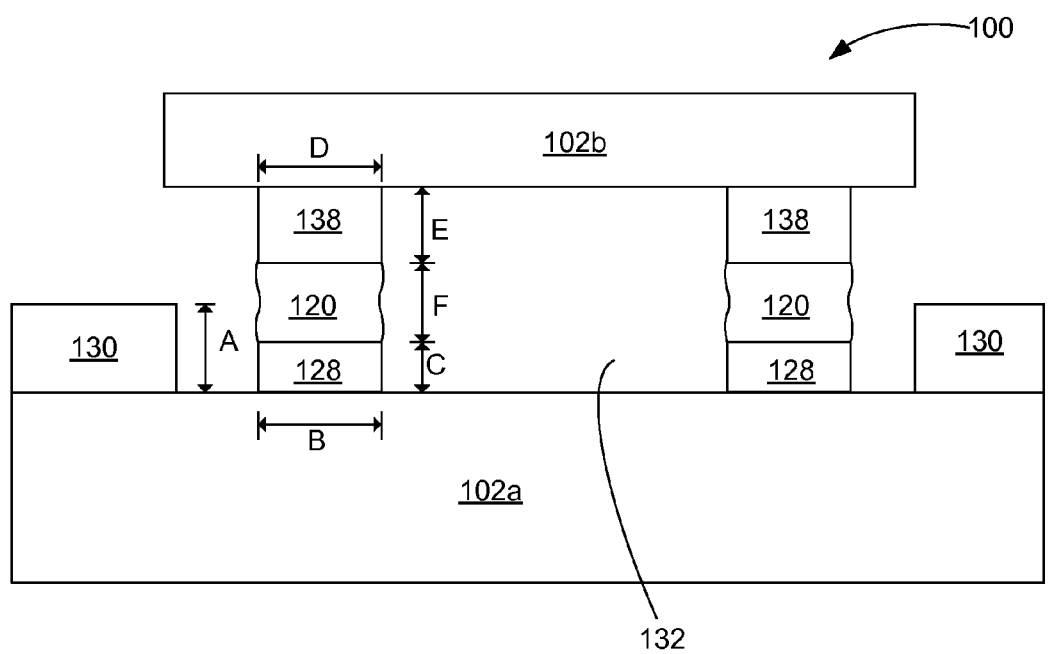

For ease of reference, IC package assembly components illustrated in the Figures are labeled with three-digit numbers in which the first digit corresponds to the Figure number (e.g., features of FIGS. 1a-1c are labeled "1XX") and the second and third digits identify the component. Therefore, while an IC package assembly component may be described with reference to a particular Figure (e.g., first die 102a of FIGS. 1a-1c), the description should be understood to apply equally to corresponding components of other Figures. For example, first die 302a of FIGS. 3a-3g, first die 502a of FIGS. 5a-5g, first die 602a of FIGS. 6a-6f, and first die 702a of FIG. 7 may have any or all of the features/configuration described for first die 102a of FIGS. 1a-1c.

As used herein, the phrase "through-silicon via" or "TSV" may be used in reference to an electrically conductive through-hole that extends at least partially through a die or other semiconductor substrate/device, such as an interposer. The phrase "through-silicon via" or "TSV" may be used for such electrically conductive features even when the semiconductor material is composed of a material other than silicon.

Embodiments described herein provide three-dimensional (3D) integrated circuit (IC) package assembly configurations and corresponding fabrication techniques. In various embodiments, an IC package assembly may include a first die embedded in a package substrate, a second die coupled with the first die, and an adhesive layer disposed between the first and second dies. The first die may be such as a microprocessor/CPU with one or more TSVs, and the package substrate may be a Bumpless Build-Up Layer (BBUL) package substrate. In some embodiments, the package substrate may be a coreless substrate. In various embodiments, the second die may be a memory die stack with multiple memory dies coupled by TSVs, and the adhesive layer may be a die backside film (DBF) layer. In various embodiments, an opening may be formed in the adhesive layer. A TSV pad on the first die and a TSV pad on the second die may be positioned on opposite sides of the opening and coupled with a die interconnect to form a conductive path. In some embodiments, an encapsulant may be applied over the second die, and/or an underfill material may be used to fill the opening in the adhesive layer or other remaining space between the adhesive layer and the second die.

In some embodiments, the opening may be formed in the adhesive layer before the package substrate is formed on the first die. In other embodiments, the opening may be formed in the adhesive layer after the package substrate is formed. In various embodiments, the opening may be formed by selectively exposing a portion of the adhesive layer to laser energy with a laser patterning projection (LPP) tool. In other embodiments, the laser energy may be applied by scanning the adhesive layer or portion thereof with a laser scanning system (e.g., a galvano scanner). In various embodiments, the laser may be a UV laser.

FIGS. 1a-1c depict schematic side cross-sectional views of an integrated circuit (IC) package assembly 100, in accordance with various embodiments. Referring first to FIG. 1a, IC package assembly 100 may include a first die 102a embedded in a package substrate 104, a second die 102b coupled with first die 102a, and a circuit board 122 coupled with package substrate 104. In some embodiments, second die 102b may include a plurality of dies arranged in a stacked three-dimensional (3D) configuration (e.g., dies 140 of FIG. 1b). In various embodiments, second die 102b may include one or more memory dies.

In various embodiments, second die 102b may be embedded in an encapsulant 108. Encapsulant 108 can be any suitable material, such as (but not limited to) an Ajinomoto Build-up Film (ABF) substrate or other build-up film, other dielectric/organic materials, resins, epoxies, polymer adhesives, silicones, acrylics, polyimides, cyanate esters, thermoplastics, and/or thermosets.

In some embodiments, first die 102a and second die 102b may be singulated dies. In other embodiments, first die 102a and/or second die 102b may include two or more dies arranged in a stack. In other embodiments, first die 102a and/or second die 102b may be a wafer (or portion thereof) having two or more dies formed thereon.

In various embodiments, first die 102a and/or second die 102b may be a primary logic die. In other embodiments, first die 102a and/or second die 102b may be configured to function as memory, an application specific circuit (ASIC), a processor, or some combination thereof. In some embodiments, first die 102a may be a CPU/processor and second die 102b may be one or more memory dies.

In some embodiments, an interface layer 124 may be provided between first die 102a and second die 102b. Interface layer 124 may be, or may include, a layer of underfill, adhesive, dielectric, or other material. Interface layer 124 may serve various functions, such as providing mechanical strength, conductivity, heat dissipation, or adhesion.

In some embodiments, package substrate 104 may be a coreless substrate. For example, package substrate 104 may be a bumpless build-up layer (BBUL) assembly that includes a plurality of "bumpless" build-up layers. As used herein, "bumpless build-up layers" may refer to layers of substrate and components embedded therein without the use of solder or other attaching means that may be considered "bumps." In various embodiments, one or more build-up layers described herein may have material properties that may be altered and/or optimized for reliability, warpage reduction, and so forth. In other embodiments, package substrate 104 may be composed of a polymer, ceramic, glass, or semiconductor material. In some embodiments, package substrate 104 may be a conventional cored substrate and/or an interposer.

First die 102a may be coupled to a first side of package substrate 104. In various embodiments, first die 102a may be embedded in package substrate 104. A second opposite side of package substrate 104 may be coupled to circuit board 122 by package interconnects 112. Package interconnects 112 may couple electrical routing features 110 disposed on the second side of package substrate 104 to corresponding electrical routing features 116 on circuit board 122. Package substrate 104 may have conductive features 134, such as traces, trenches, and/or vias, formed therein to route electrical signals between the first/second die 102a/102b and circuit board 122 and/or other electrical components external to the IC package assembly 100. Package interconnects 112 may include any of a wide variety of suitable structures and/or materials including, for example, bumps, pillars or balls formed using metals, alloys, solderable material, or combinations thereof. In various embodiments, electrical routing features 110 may be arranged in a ball grid array (BGA) or other configuration.

In some embodiments, circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. The circuit board 122 may be composed of other suitable materials in other embodiments.

Some portions/features of circuit board 122 may not be depicted in FIG. 1a. In various embodiments, the circuit board 122 may include other electrical devices coupled to the circuit board that are configured to route electrical signals to or from first/second die 102a/102b through the circuit board 122. In some embodiments, circuit board 122 may include structures such as traces, trenches, and/or vias formed therein to route electrical signals through the circuit board 122. In some embodiments, the circuit board 122 may be a motherboard (e.g., motherboard 722 of FIG. 7).

FIG. 1b depicts a schematic side cross-sectional view of a die portion of IC package assembly 100, in accordance with various embodiments. As illustrated, first die 102a may have a first side S1 and a second side S2 opposite to the first side S1. First side S1 may be the side of the die commonly referred to as the "active" or "top" or "front" side of the die. First side S1 may include one or more transistors. Second side S2 may be the side of the die commonly referred to as the "inactive" or "bottom" or "back" side of the die.

First side S1 may include an active layer 114 with one or more transistors formed thereon. The one or more transistors may be located below the outer surface of first side S1 and are routed to the outer surface of first side S1 by a series of metal and oxide layers. Second side S2 may include a semiconductor substrate 118 composed of a semiconductor material. The semiconductor substrate 118 may be composed of n-type or p-type material systems and may include, for example, a crystalline substrate formed using a bulk silicon or a silicon-on-insulator substructure. In some embodiments, the semiconductor substrate 118 may be formed using alternate materials, which may or may not be combined with silicon, that include but are not limited to germanium, indium antimonide, lead telluride, indium arsenide, indium phosphide, gallium arsenide, or gallium antimonide. Other group II-VI, III-V or group IV material systems may also be used to form the semiconductor substrate 118 according to various embodiments.

In various embodiments, first die 102a may include one or more through-silicon vias (TSVs) 126 formed at least partially through semiconductor substrate 118. First side S1 of first die 102a may include electrical routing features 106. In some embodiments, electrical routing features 106 may be bond pads. Second side S2 may also include one or more electrical routing features 128. In some embodiments, electrical routing features 128 may be TSV pads coupled to corresponding TSVs 126. TSVs 126 may be configured to route electrical signals between the active layer 114 on first side S1 and the electrical routing features 128 on second side S2 of die 102a.

In some embodiments, second die 102b may include a plurality of dies 140 and one or more TSVs 136 disposed through some or all of the dies 140. In various embodiments, electrical routing features 138 may be provided on one or more of the dies 140 of second die 102b. One or more of the electrical routing features 138 may be electrically coupled with a corresponding TSV 136. The dies 140 may be coupled together using any suitable technique including, for example, interconnect structures such as, for example, pads, bumps, pillars, solderable material, or combinations thereof. That is, the TSVs 136 may not be composed of a single, contiguous material structure as depicted in some embodiments.

Electrical routing features 128/138 may be electrically conductive pads, bumps, pillars, or other such structures. In various embodiments, electrical routing features 128/138 may have one or more layers of metal, including but not limited to nickel, palladium, platinum, tin, silver, gold, copper, or other metals, alone or in any combination. In some embodiments, electrical routing features 128 may have one or more layers of copper. In other embodiments, electrical routing features 138 may have an outer surface of gold.

The electrical routing features 138 of second die 102b may be coupled with the electrical routing features 128 of first die 102a by die interconnects 120. In various embodiments, die interconnects 120 may be formed using a solderable material (e.g., solder paste, solder balls). In some embodiments, a first TSV 126 of first die 102a may be coupled with a second TSV 136 of second die 102b by corresponding electrical routing features 128/138 and die interconnect 120 to form a conductive path 142 that extends at least partially through first die 102a and second die 102b. Conductive path 142 may route electrical signals between second die 102b and first die 102a. In some embodiments, the electrical signals may include, for example, input/output (I/O) signals and/or power or ground signals associated with the operation of first die 102a/second die 102b.

Second die 102b may be coupled to first die 102a in a front-to-back configuration (e.g., the "front" or "active" side of second die 102b coupled to the "back" or "inactive" side S1 of first die 102a), as shown for example in FIG. 1b. In other configurations, first and second dies 102a/102b may be coupled with one another in a back-to-back arrangement. In various embodiments, one or more additional dies may be coupled with first die 102a, second die 102b, and/or with package substrate 104.

In some embodiments, an adhesive layer 130 may be disposed on the second side S2 of first die 102a. Adhesive layer 130 may include a polymer matrix. Examples of suitable materials for adhesive layer 130 may include, but are not limited to, epoxy, acrylic, polyimide, epoxy-acrylate, other polymer materials, and combinations thereof. In various embodiments, adhesive layer 130 may be a die backside film (DBF).

In some embodiments, adhesive layer 130 may include an opening 132, and one or more of the electrical routing features 128 and/or die interconnects 120 may be positioned within opening 132. In some embodiments, an opening 132 may correspond to the entire adhesive layer 130. For example, in some IC package assemblies, forming opening 132 may include removing the entire adhesive layer 130.

As illustrated for example in FIGS. 1a-1b, an interface layer 124 may be formed between first die 102a and second die 102b by adding an underfill material or other suitable material into opening 132 and/or between adhesive layer 130 and second die 102b. One or both of interface layer 124 and adhesive layer 130 may impart mechanical strength/warpage resistance to IC package assembly 100. Again, some embodiments may lack adhesive layer 130 and opening 132. For example, in some embodiments, adhesive layer 130 may be applied to first die 102a at one stage of IC package assembly fabrication, and subsequently removed before fabrication is completed.

Spacing/pitch of features such as electrical routing features 128/138 and die interconnects 120 may vary among embodiments. In some embodiments, the distance between adjacent electrical routing features 128 and/or adjacent electrical routing features 138 may be in the range of 30-80 µm, 40-100 µm, less than 40 µm, or more than 100 µm.

Referring now to FIG. 1c, dimensions of features such as electrical routing features 128/138, adhesive layer 130, and die interconnects 120 may vary among embodiments.

In various embodiments, adhesive layer 130 may have a thickness (Arrow A) of less than 10 µm. In other embodiments, adhesive layer 130 may have a thickness (Arrow A) in the range of 0.1-20 µm, 0.1-9.9 µm, 1-9.9 µm, or 5-9.9 µm.

In various embodiments, electrical routing features 128 may have a width (Arrow B) of 20 µm and a height/thickness (Arrow C) of 3 µm. In other embodiments, electrical routing features 128 may have a width (Arrow B) in the range of 5-40 µm, 10-30 µm, or 15-25 µm, and a height/thickness (Arrow C) in the range of 0.5-15 µm, 1-10 µm, or 2-5 µm.

In various embodiments, electrical routing features 138 may have a width (Arrow D) of 20 µm and a height/thickness (Arrow E) of 10 μm. In other embodiments, electrical routing features 138 may have a width (Arrow D) in the range of 5-40 μm, 10-30 μm, or 15-25 μm, and a height/thickness (Arrow E) in the range of 1-20 μm, 5-15 μm, or 8-12 μm.

In various embodiments, die interconnect 120 may have a height/thickness (Arrow F) of 10 μm. In other embodiments, die interconnect 120 may have a height/thickness (Arrow F) in the range of 1-20 μm, 5-15 μm, or 8-12 μm.

In a particular embodiment, adhesive layer 130 may have a thickness (Arrow A) of less than 10 μm, electrical routing features 128 may have a width (Arrow B) of 20 μm and a height/thickness (Arrow C) of 3 μm, electrical routing features 138 may have a width (Arrow D) of 20 μm and a height/thickness (Arrow E) of 10 μm, and die interconnect 120 may have a height/thickness (Arrow F) of 10 μm.

In various embodiments, adhesive layer 130 may be applied to the second side S2 of first die 102a and subsequently coupled with a sacrificial panel. A package substrate (e.g., package substrate 104) may then be formed on, or coupled with, the first side S1 of first die 102a, and the sacrificial panel may then be removed. In some embodiments, adhesive layer 130 may cover electrical routing features 128 during the build-up process, and opening 132 may be formed through adhesive layer 130 to expose electrical routing features 128 after removal of the sacrificial panel. In other embodiments, opening 132 may be formed in adhesive layer 130 before applying adhesive layer 130 to first die 102a, and adhesive layer 130 may be positioned on second side S2 such that one or more of the electrical routing features 138 are within opening 132. In such embodiments, electrical routing features 128 may be exposed by removal of the sacrificial panel after the build-up process. In any case, second die 102b may be coupled with first die 102a after electrical routing features 138 have been exposed.

In other embodiments, adhesive layer 130 may be coupled with the sacrificial panel, and opening 132 may be formed in adhesive layer 130, before coupling first die 102a with adhesive layer 130. Opening 132 may be formed in adhesive layer 130 either before or after adhesive layer 130 is coupled with the sacrificial panel. First die 102a may then be coupled with adhesive layer 130 by positioning second side S2 on adhesive layer 130 such that one or more of the electrical routing features 128 is disposed within opening 132. Package substrate 104 may then be formed on, or otherwise coupled with, the first side S1 of first die 102a. The sacrificial panel may then be removed to expose electrical routing features 128. In other embodiments, adhesive layer 130 may cover electrical routing features 128 during the build-up process, and opening 132 may be formed in adhesive layer 130 after the formation of the build-up layers and removal of the sacrificial panel. In any case, as described more fully below, opening 132 may be formed by exposure of adhesive layer 130 to radiation energy.

Figure 2:
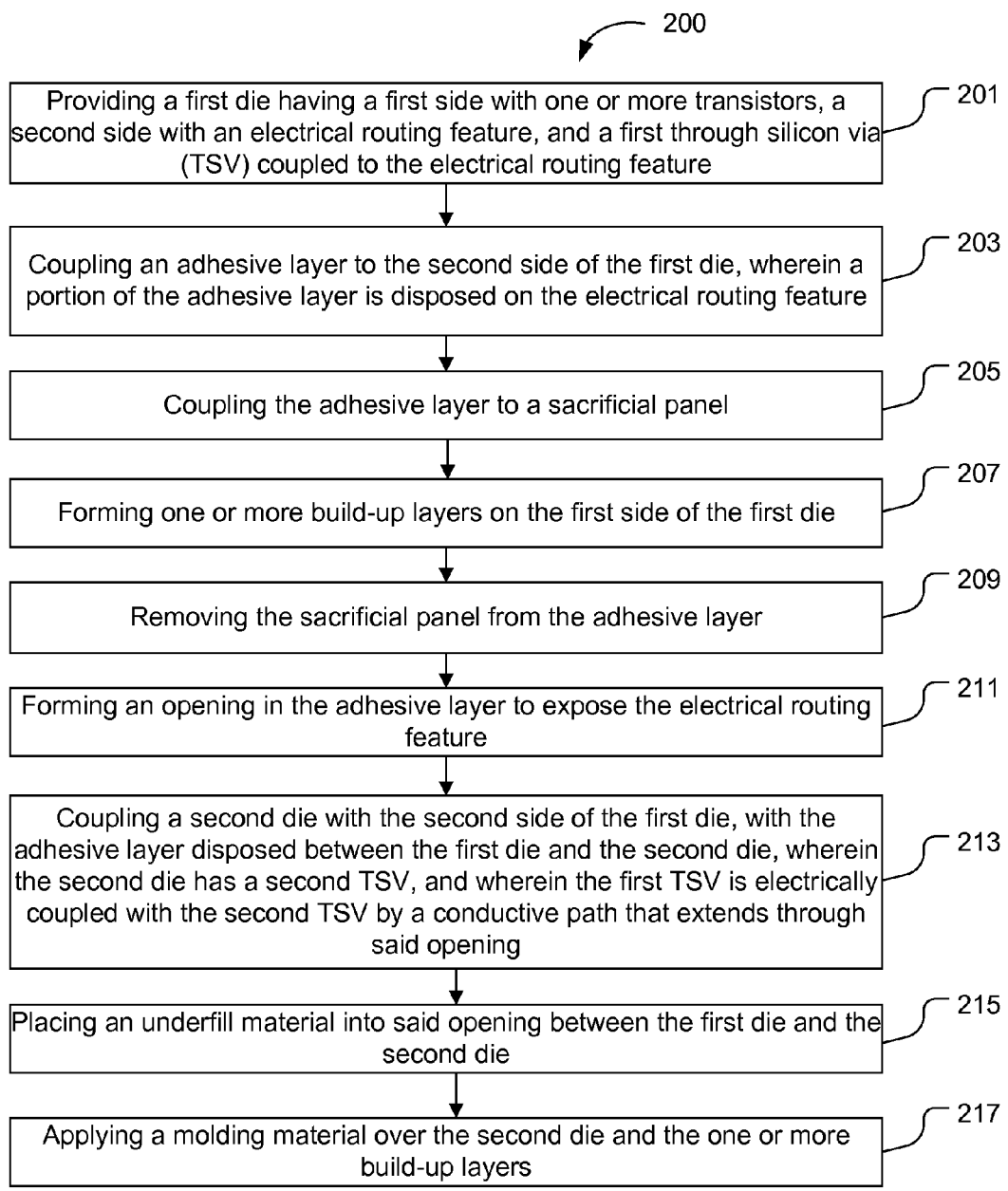
FIG. 2 schematically illustrates a flow diagram for a method of fabricating an IC package assembly, in accordance with some embodiments.
Figure 3A:
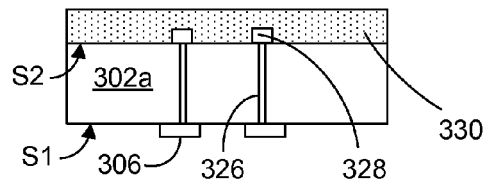
FIGS. 3a-3g schematically illustrate various stages of IC package assembly fabrication, in accordance with various embodiments.
Figure 3B:
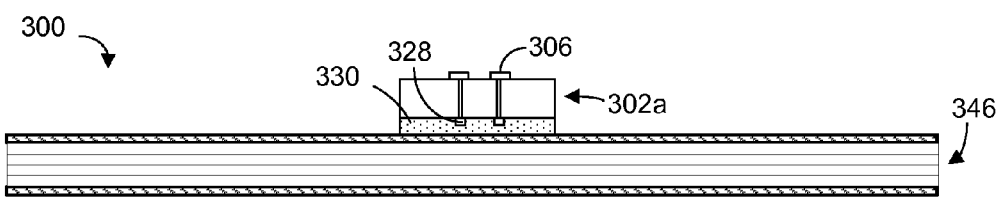
Figure 3C:
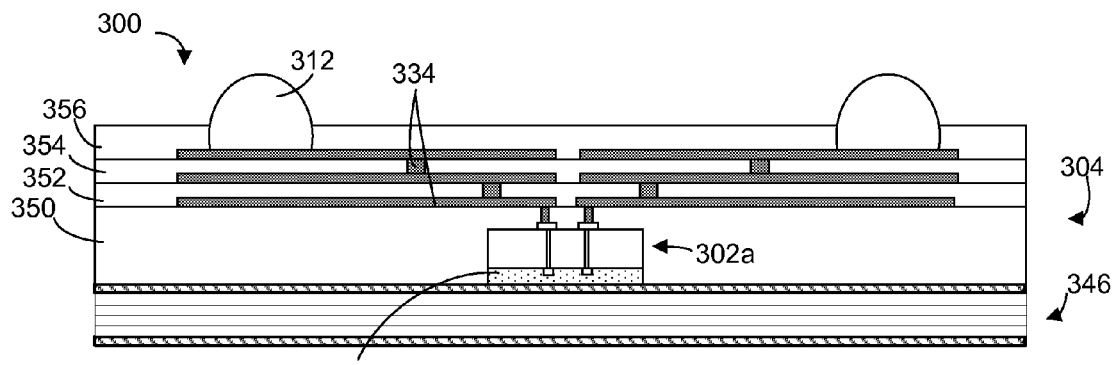
Figure 3D:
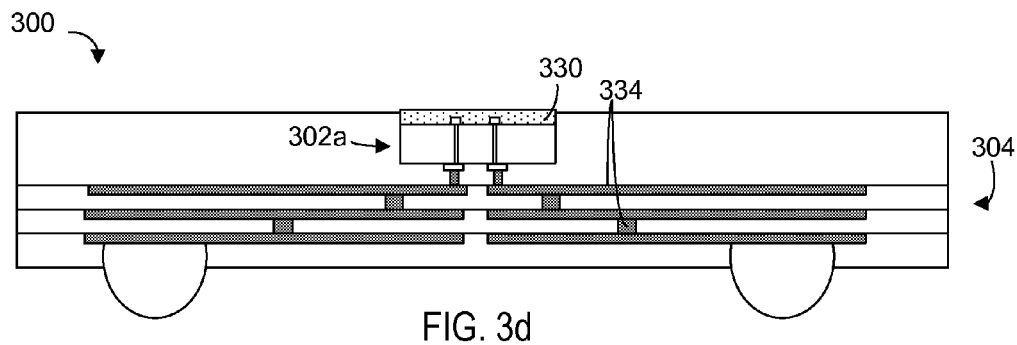
Figure 3E:
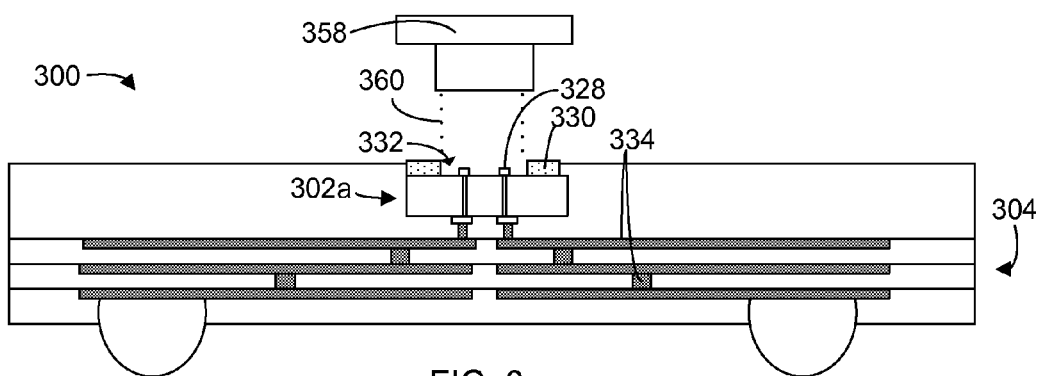
Figure 3F:
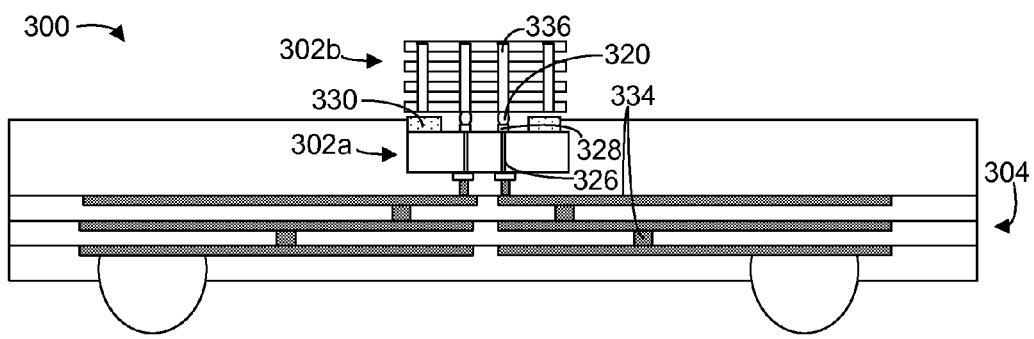
Figure 3G:
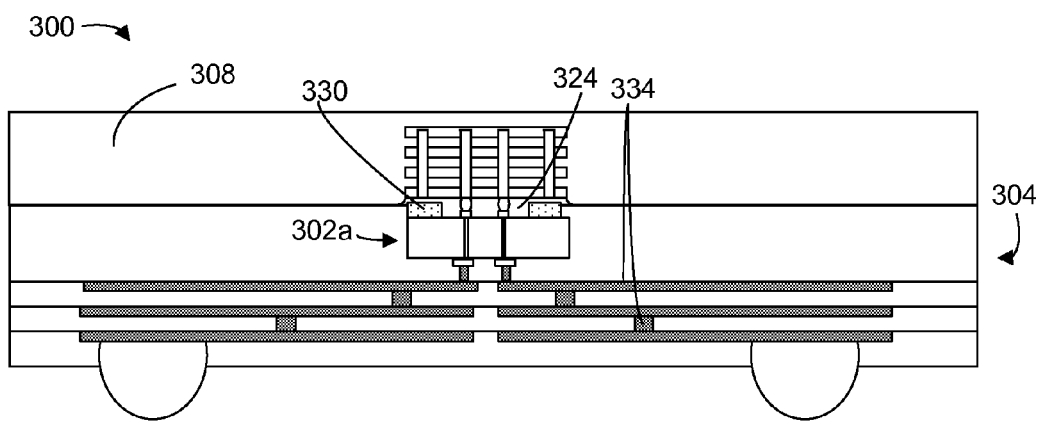
Figure 4:
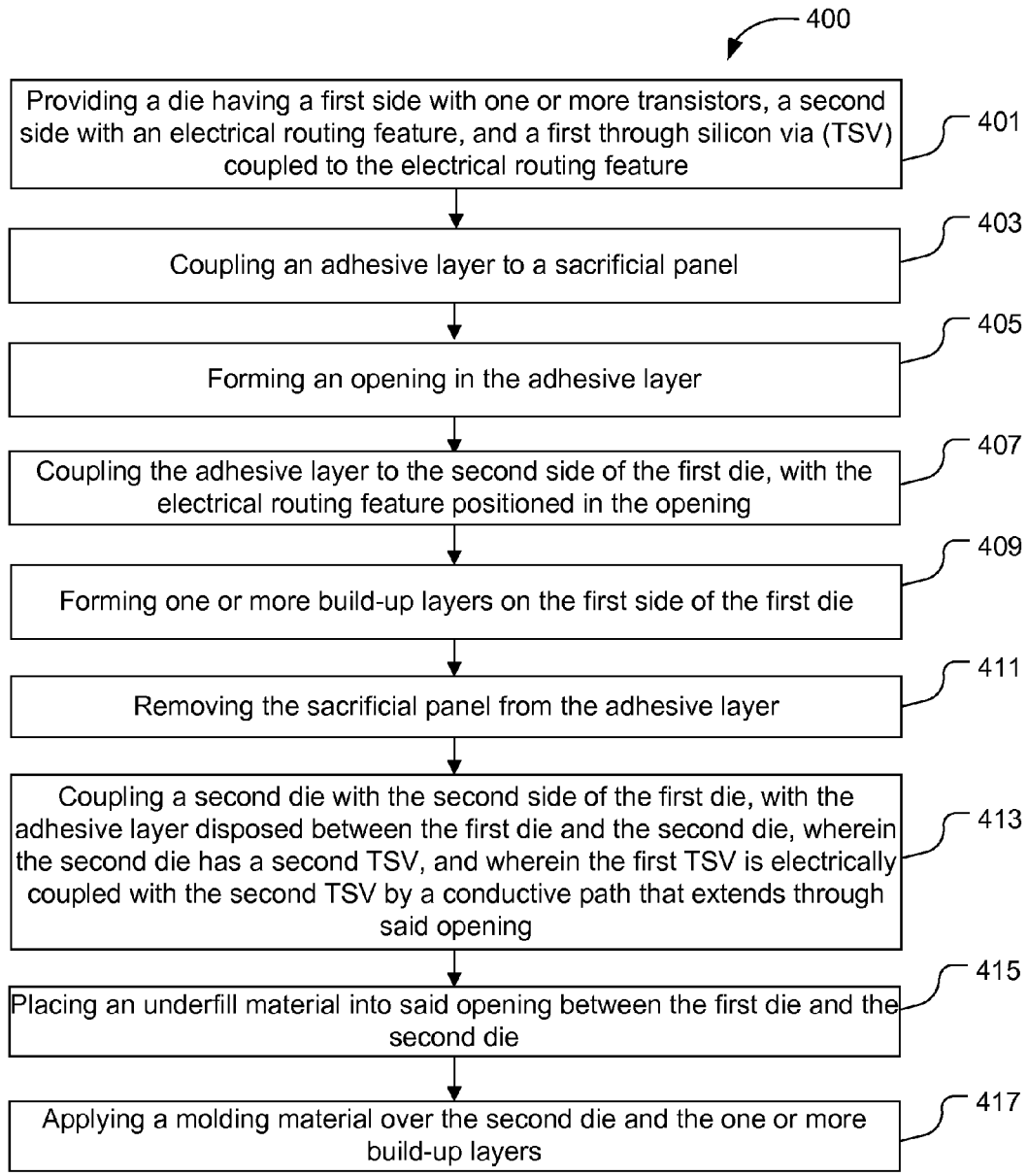
FIG. 4 schematically illustrates a flow diagram for a method of fabricating an IC package assembly, in accordance with some embodiments.

FIGS. 2 and 4 schematically illustrate flow diagrams for methods of fabricating an IC package assembly, in accordance with some embodiments. FIGS. 3a-3g depict various stages of fabrication corresponding to the methods illustrated in FIG. 2. FIGS. 5a-5f and FIGS. 6a-6f depict various stages of fabrication corresponding to methods illustrated in FIG. 4.

While some Figures illustrate fabrication processes on only one side of a sacrificial panel for ease of reference, it is to be understood that any of the methods described herein may be performed on opposite sides of the same sacrificial panel and/or along multiple portions of the same side of the sacrificial panel.

Referring first to FIG. 2, method 200 may be begin at block 201 with providing a first die having a first side with one or more transistors, a second side with an electrical routing feature (e.g., electrical routing feature 128), and a first TSV (e.g., TSV 126) coupled to the electrical routing feature.

At block 203, an adhesive layer may be coupled with the second side of the first die. FIG. 3a illustrates a corresponding stage of fabrication of an IC package assembly 300. As illustrated, adhesive layer 330 may be coupled with the second side S2 of first die 302a and may cover one or more electrical routing features 328. In various embodiments, electrical routing features 328 may be TSV pads, and a first TSV 326 may be conductively coupled to a TSV pad 328. In various embodiments, adhesive layer 330 may be coupled with first die 302a either before or after first die 302a is singulated from a wafer.

At block 205, the adhesive layer may be coupled to a sacrificial panel. As shown for example in FIG. 3b, sacrificial panel 346 may have one or more layers arranged in a stacked configuration. For example, sacrificial panel 346 may include an epoxy core disposed between one or more outer layers of a metal, such as copper foil. In particular embodiments, one or more of the outer layers of sacrificial panel 346 may be configured to remain adhered to adhesive layer 330 as other layers are mechanically peeled away. The outer layer(s) may be subsequently removed from adhesive layer 330 by a conventional etching process.

At block 207, one or more build-up layers may be formed on the first side of the first die. FIG. 3c illustrates a corresponding stage of fabrication of IC package assembly 300 with a coreless package substrate 304 that includes a plurality of build-up layers 350, 352, 354, and 356. The number and configuration of build-up layers may vary among embodiments. While four build-up layers are illustrated by way of example, in other embodiments package substrate 304 may have one, two, three, or more than four build-up layers. In some embodiments, the build-up layer(s) may be formed sequentially on first die 302a. In other embodiments, package substrate 304 may be formed in a separate process and subsequently coupled with first die 302a.

In some embodiments, the first build-up layer 350 may be formed by laminating a layer of dielectric material (e.g., ABS film) onto the first side S1 of first die 302a, drilling vias through the dielectric material (e.g., by laser drilling) to electrical routing features 306, filling/plating the vias with an electrically conductive material (e.g., copper), and forming electrically conductive traces on the dielectric material and vias by known methods. Additional build-up layers 352, 354, and 356 may be formed sequentially in the same or similar manner. Openings may be drilled in the outermost layer 356 to one or more of the conductive features (e.g., conductive features 334 such as vias or traces, or electrical routing features 110 of FIG. 1a), and package interconnects 312 may be formed in the openings. In some embodiments, adhesive layer 330 may be cured as the build-up layers are formed (e.g., cured by heat, pressure, and/or UV light).

At block 209, the sacrificial panel may be removed from the adhesive layer, exposing the adhesive layer. In various embodiments, some portion of the sacrificial layer, such as an epoxy core, may be peeled away from another portion (e.g., layer of copper foil) that remains adhered to the adhesive layer. This remaining portion may be removed by a conventional etching process. FIG. 3d illustrates a corresponding stage of fabrication, in which the sacrificial panel 346 has been removed from adhesive layer 330 and package substrate 304.

At block 211, an opening may be formed in the adhesive layer to expose the electrical routing feature. FIG. 3e illustrates a corresponding stage of fabrication, in accordance with various embodiments. As illustrated, laser radiation source 358 may be used to selectively ablate a portion of adhesive layer 330, thereby forming an opening 332 in adhesive layer 330 to expose electrical routing features 328. In various embodiments, laser radiation 360 may be ultraviolet (UV) laser radiation, and laser radiation source 358 may be a carbon dioxide (CO2) laser, a carbon monoxide (CO) laser, a neodymium-doped yttrium aluminum garnet (Nd:YAG) laser in various harmonics, an excimer laser, or any other suitable type of laser radiation source. In some embodiments, laser radiation source 358 may be a pulsed laser. In other embodiments, laser radiation source 358 may be a continuous laser. In some embodiments, laser radiation 360 may be laser radiation of a short visible wavelength, such as green (e.g., 532 nm).

In various embodiments, opening 332 may be formed by ablating some or all of adhesive layer 330 with a beam scanner-based system or a mask projector-based system. In various embodiments, opening 332 may be formed by laser projection patterning (LPP). LPP may be used in some embodiments to expose the entire selected area without scanning/skiving and at a relatively low fluence (e.g., 0.3-0.8 J/cm$^2$) with little or no damage to electrical routing features 328. In other embodiments, a galvano scanner may be used to controllably remove the selected area with the laser radiation to form opening 332. Again, the laser radiation may have a relatively low fluence that is below a laser damage threshold for electrical routing features 328 and/or second side S2 of first die 302a. In some embodiments, all of adhesive layer 330 may be removed.

In some embodiments, block 211 may further include a desmear process to remove any remaining substrate residue from electrical routing features 328. In other embodiments, block 211 may further include a cleaning process (e.g., with flux) to remove oxidation/contaminants from the outer surface of electrical routing features 328. Other embodiments may omit one or both of the desmear/cleaning processes.

At block 213, a second die may be coupled with the second side of the first die, with the adhesive layer disposed between the first die and the second die. In various embodiments, second die 302b may be coupled with first die 302a using a die attach tool, or by other techniques suitable for use in fine pitch applications (e.g., bump pitches of less than 100 μm) such as thermal compression bonding (TCB). In some embodiments, solder balls may be used to couple TSVs of the first die to TSVs of the second die.

FIG. 3f illustrates a corresponding stage of fabrication. As illustrated, second die 302b may have one or more TSVs 336 and first die 302a may have one or more TSVs 326. A die interconnect 320 (e.g., a solder) may be formed between a first TSV 326 of first die 302a and a second TSV 336 of second die 302b. TSVs 326 and 336, electrical routing features 328/138 (see FIGS. 3f and 1b, respectively), and die interconnect 320 may collectively form a conductive path (e.g., conductive path 142, FIG. 1b) that extends through opening 332 of adhesive layer 330. In some embodiments, die interconnect 320 may be formed by conventional methods, such as by solder paste printing/reflow techniques.

At block 215, an underfill material may be placed into the opening between the first die and the second die. At block 217, an encapsulant (e.g., a molding material) may be applied over the second die and the one or more build-up layers. FIG. 3g illustrates a corresponding stage of fabrication. As illustrated, underfill material may be added between first die 302a and second die 302b to form an interface layer 324. Interface layer 324 may substantially fill opening 332 and/or remaining space between second die 302b and adhesive layer 330. In some embodiments, all of adhesive layer 330 may be removed in block 209, and underfill material may be used to fill some or all of the space between first die 302a and second die 302b. In other embodiments, encapsulant 308 may be formed over second die 302b and/or package substrate 304.

Some embodiments may include both blocks 215 and 217. In other embodiments, one or both of blocks 215 and 217 may be omitted. For example, in some embodiments, block 215 may be omitted. In other embodiments, block 217 may be omitted. In still other embodiments, both block 215 and block 217 may be omitted.

In other embodiments, an adhesive layer may be patterned to form the opening before coupling the first die with the adhesive layer, such that the adhesive layer does not contact the electrical routing features (e.g., TSV pads). FIG. 4 illustrates an example of such an embodiment. FIGS. 5a-5g and 6a-6g illustrate two variations of the embodiment of FIG. 4.

Referring now to FIG. 4, method 400 may be begin at block 401 with providing a first die (e.g., first die 102a of FIG. 1) having a first side with one or more transistors, a second side with an electrical routing feature (e.g., electrical routing feature 128), and a first TSV (e.g., TSV 126) coupled to the electrical routing feature.

At block 403, an adhesive layer may be coupled to a sacrificial panel. In some embodiments, as illustrated by way of example in FIG. 5a, block 403 may include forming an outermost copper layer 570 on a sacrificial panel 546 and forming an opening 572 in the outermost copper layer 570. Adhesive layer 530 may be positioned within the opening 572 by conventional techniques, such as with a pick-and-place tool.

Figure 6A:
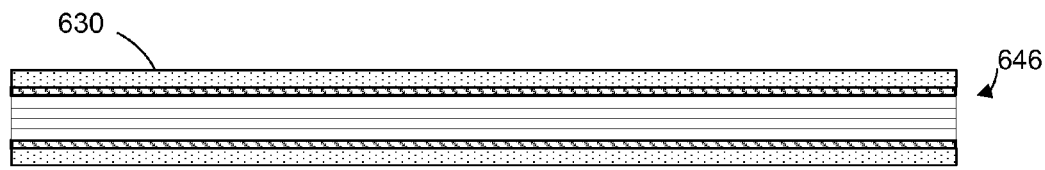
FIGS. 6a-6f schematically illustrate various stages of IC package assembly fabrication, in accordance with various embodiments.
Figure 6B:
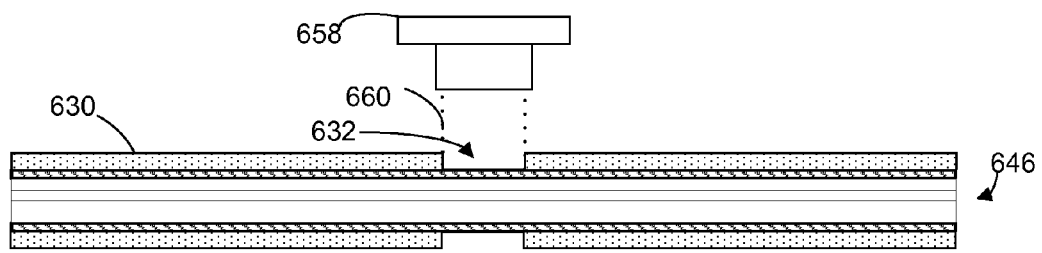

Alternatively, as illustrated by way of example in FIG. 6a, adhesive layer 630 may be coupled with a sacrificial panel 646 without forming outermost copper layer 570 or opening 572.

At block 405, an opening may be formed in the adhesive layer. As shown by way of example in FIGS. 5b and 6b, openings 532/632 may be formed in adhesive layer 530/630 by using a laser radiation source 558/658 to expose a selected area of adhesive layer 530/630 to laser radiation 560/660.

Figure 5A:
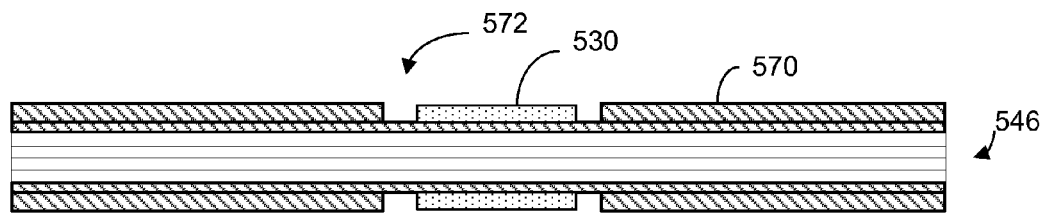
FIGS. 5a-5f schematically illustrate various stages of IC package assembly fabrication, in accordance with various embodiments.
Figure 5B:
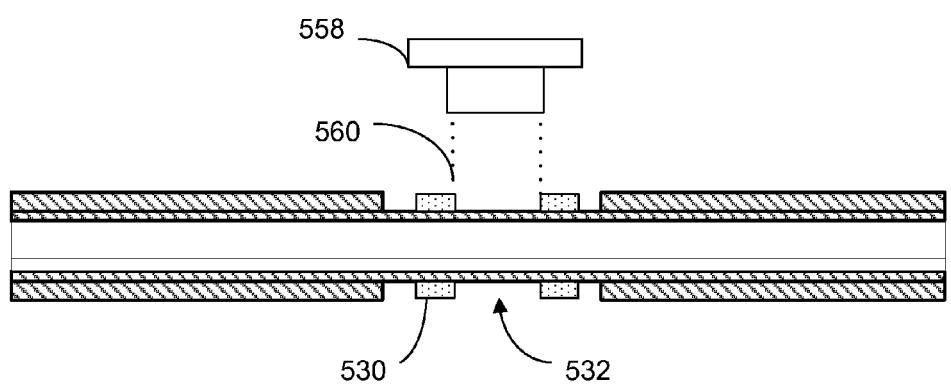
Figure 5C:
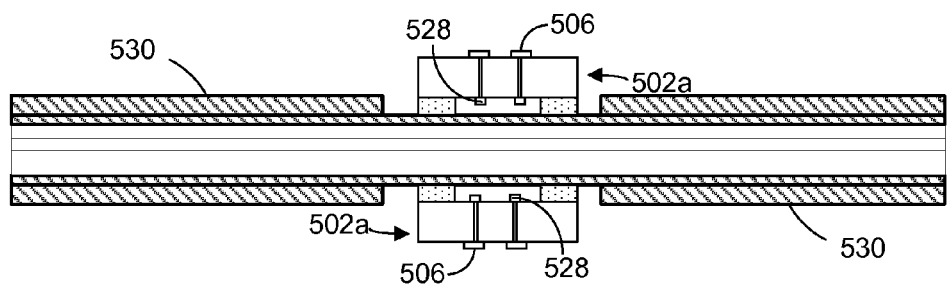
Figure 6C:
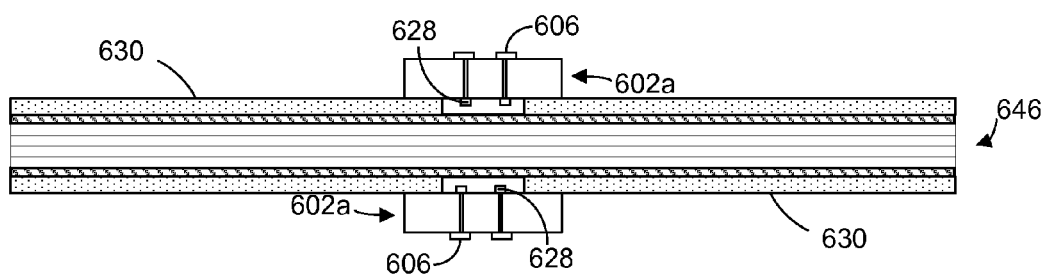

At block 407, the adhesive layer may be coupled to the second side of the first die, with the electrical routing feature positioned in the opening. FIGS. 5c and 6c illustrate corresponding stages of fabrication. As illustrated, positioning first die 502a/602a with electrical routing features 528/628 in opening 532/632 may reduce or eliminate contact between electrical routing features 528/628 and adhesive layer 530/630. This may reduce or eliminate the need for a subsequent descum process.

Figure 5D:
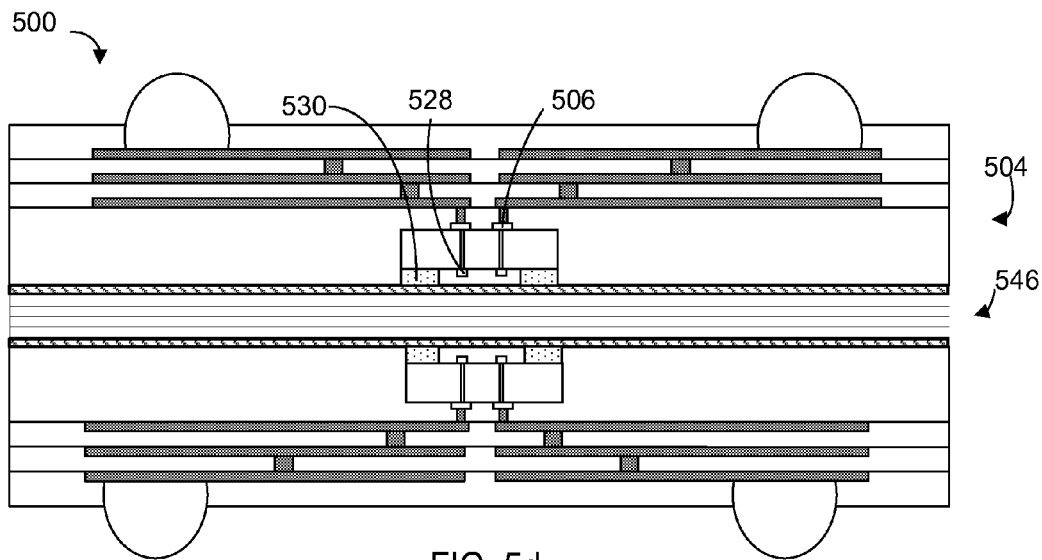
Figure 6D:
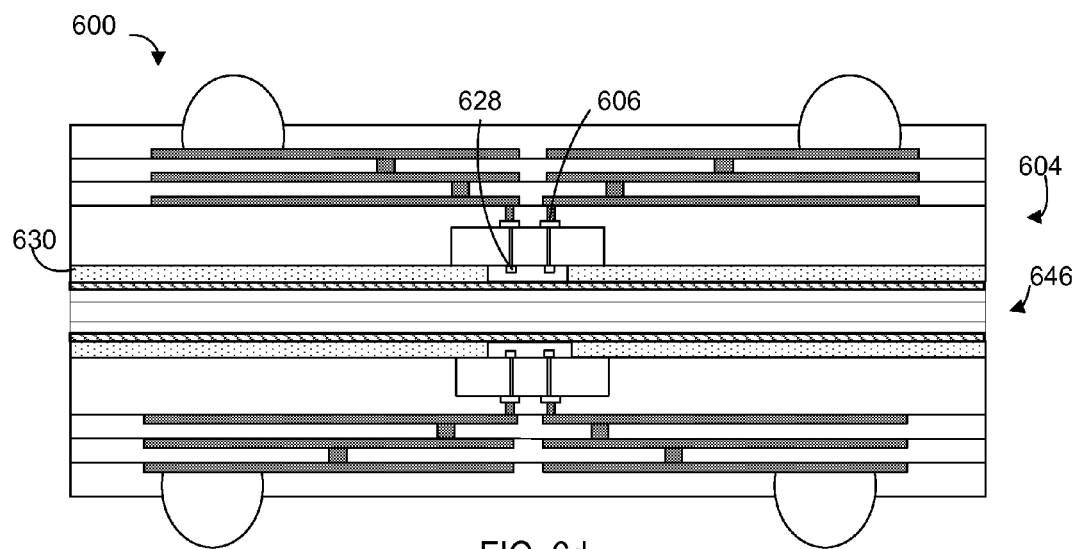

At block 409, one or more build-up layers may be formed on the first die. FIGS. 5d and 6d illustrate corresponding stages of fabrication. As illustrated, a package substrate 504/604 (e.g., a BBUL substrate with one or more build-up layers) may be formed sequentially on first die 502a/602a and electrical routing features 506/606.

At block 411, the sacrificial panel may be removed from the IC package assembly as described above in connection with block 209 of FIG. 2.

Blocks 413, 415, and 417 may be performed in the same or similar manner as described with reference to blocks 213, 215, and 217 of FIG. 2.

Figure 5E:
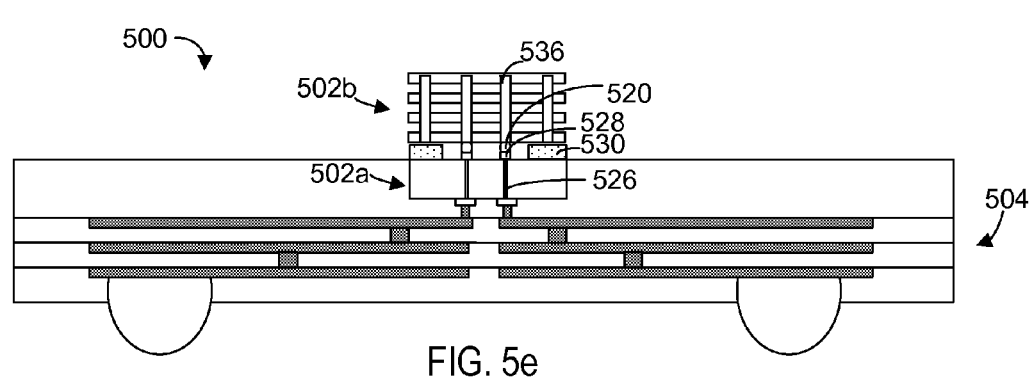
Figure 6E:
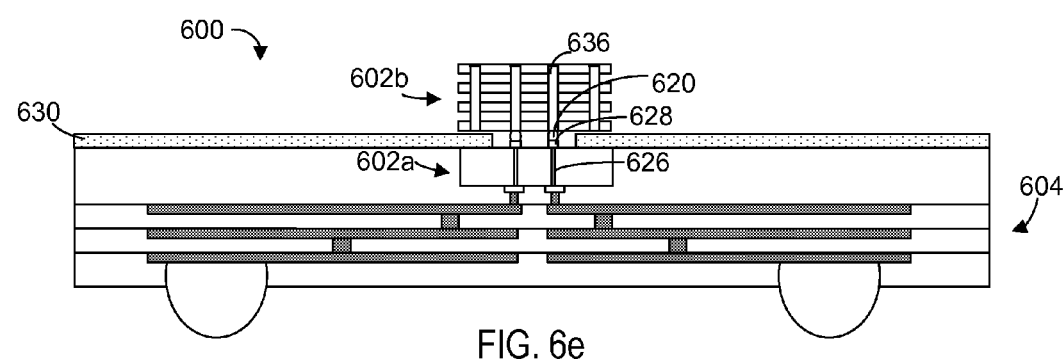

At block 413, illustrated by way of example in FIGS. 5e and 6e, a second die 502b/602b may be coupled with the second side of the first die 502a/602a. Adhesive layer 530/630 may be disposed between the first die 502a/602a and the second die 502b/602b. In various embodiments, second die 502b/602b may be coupled with first die 502a/602a using a die attach tool, or by other techniques such as thermal compression bonding (TCB).

A die interconnect 520/620 (e.g., a solder ball) may be formed between a first TSV 526/626 of first die 502a/602a and a second TSV 536/636 of second die 502b/602b. TSVs 526/626 and 536/636, electrical routing features 528/628, corresponding electrical routing features of second die 502b/602b (see e.g., electrical routing features 138, FIG. 1b), and die interconnect 520/620 may collectively form a conductive path (see e.g., conductive path 142, FIG. 1b) that extends through opening 532/632 of adhesive layer 530/630. In some embodiments, die interconnect 520/620 may be formed by conventional methods, such as by solder paste printing/reflow techniques.

Figure 5F:
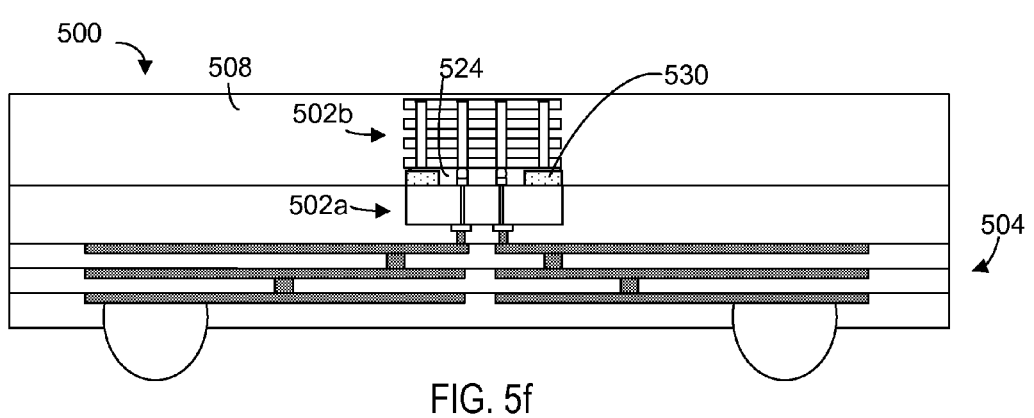
Figure 6F:
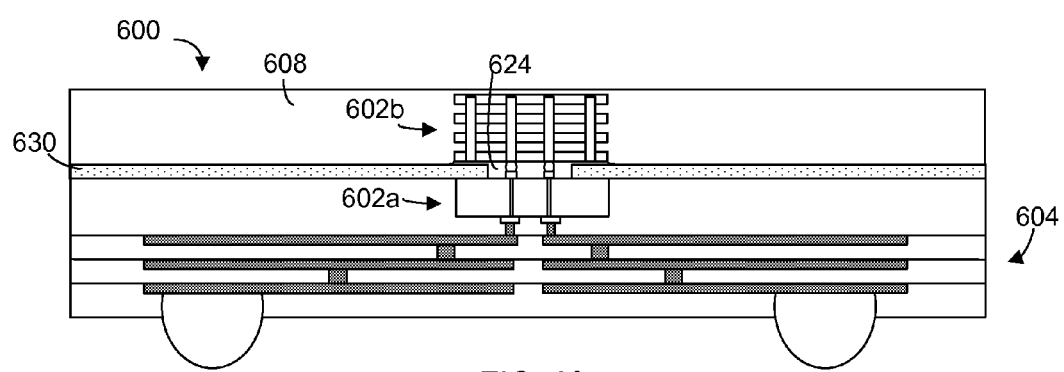

At block 415, an underfill material may be placed into the opening between the first die and the second die. At block 417, an encapsulant (e.g., a molding material) may be applied over the second die and the one or more build-up layers. FIGS. 5f and 6f illustrate corresponding stages of fabrication. In various embodiments, underfill material may be used to form an interface layer 524/624. In other embodiments, encapsulant 508/608 may be formed over second die 502b/602b and/or package substrate 504/604. Again, some embodiments may include both blocks 415 and 417. In other embodiments, one or both of blocks 415 and 417 may be omitted. For example, in some embodiments, block 415 may be omitted. In other embodiments, block 417 may be omitted. In still other embodiments, both block 415 and block 417 may be omitted.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 7:
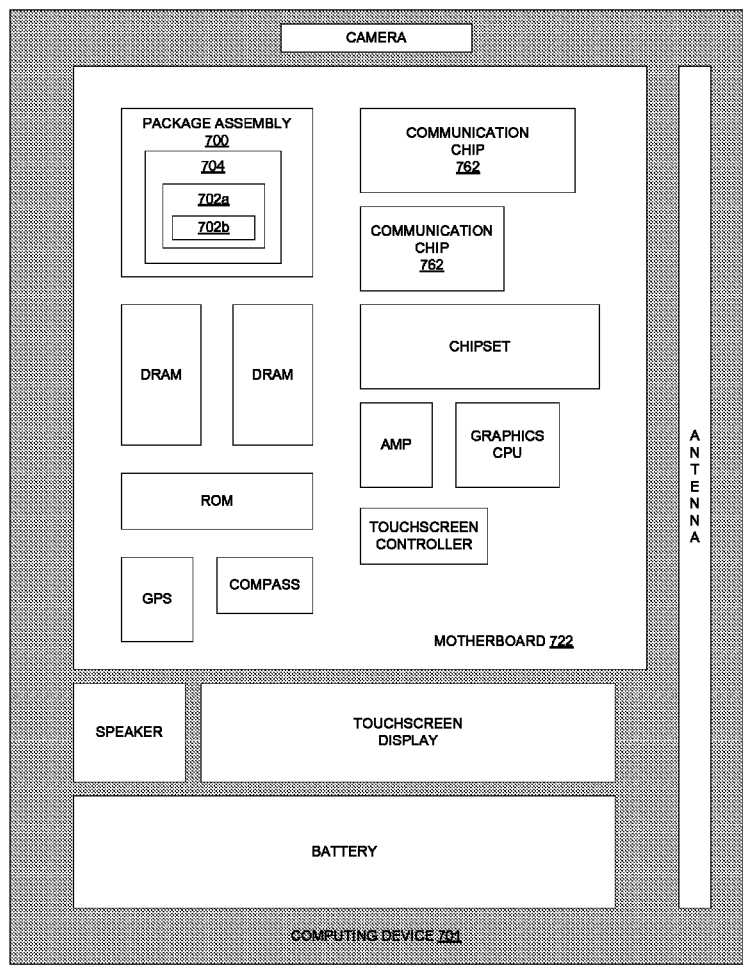
FIG. 7 schematically illustrates a computing device in accordance with various embodiments.

FIG. 7 illustrates an example computing device 701, in accordance with various embodiments. IC package assemblies as described herein may be installed on a computing/communicating device. For example, IC package assembly 700 may be installed on a computing device 701. IC package assembly 700 may include a first die 702a embedded in a package substrate 704 and a second die 702b coupled with the first die 702a. Components, features, and/or configurations of IC package assembly 700 may be as described herein with reference to any of IC package assemblies 100, 300, 500, and/or 600.

The computing device 701 may house a circuit board such as motherboard 722. The motherboard 722 may include a number of components, including but not limited to IC package assembly 700 and at least one communication chip 762. The IC package assembly 700 may be physically and electrically coupled to the motherboard 722 (e.g., circuit board 122 of FIG. 1). In some implementations, communication chip(s) 762 may also be physically and electrically coupled to the motherboard 722. In further implementations, the communication chip(s) 762 may be part of the IC package assembly 700. In various embodiments, at least one communication chip 762 may be physically and electrically coupled to IC package assembly 700. In further implementations, a communication chip 762 may be part of IC package assembly 700, e.g., as an additional die on or embedded in build-up layers in IC package assembly 700. For these embodiments, IC package assembly 700 and communication chip 762 may be disposed on the motherboard 722. In alternate embodiments, the various components may be coupled without the employment of motherboard 722.

In some embodiments, a die of IC package assembly 700 (e.g., first die 702a) may be a processor of the computing device 701. The term "processor" may refer to any device or portion of a device that processes electronic data from registers and/or memory to transform that electronic data into other electronic data that may be stored in registers and/or memory.

Depending on its applications, computing device 701 may include other components that may or may not be physically and electrically coupled to the motherboard 722. These other components include, but are not limited to, volatile memory (e.g., dynamic random access memory, also referred to as "DRAM"), non-volatile memory (e.g., read only memory, also referred to as "ROM"), flash memory, an input/output controller, a digital signal processor (not shown), a crypto processor (not shown), a graphics processor, one or more antenna, a display (not shown), a touch screen display, a touch screen controller, a battery, an audio codec (not shown), a video codec (not shown), a global positioning system ("GPS") device, a compass, an accelerometer (not shown), a gyroscope (not shown), a speaker, a camera, and a mass storage device (such as hard disk drive, a solid state drive, compact disk ("CD"), digital versatile disk ("DVD"))(not shown), micromirrors (not shown), and so forth. In various embodiments, various components may be integrated with other components to form a System on Chip ("SoC"). In further embodiments, some components, such as DRAM, may be embedded in or within IC package assembly 700.

The communication chip(s) 762 may enable wired and/or wireless communications for the transfer of data to and from the computing device 701. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 762 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 762 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 762 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 762 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 762 may operate in accordance with other wireless protocols in other embodiments.

The computing device 701 may include a plurality of communication chips 762. For instance, a first communication chip 762 may be dedicated to shorter range wireless communications such as Wi-Fi and Bluetooth and a second communication chip 762 may be dedicated to longer range wireless communications such as GPS, EDGE, GPRS, CDMA, WiMAX, LTE, Ev-DO, and others.

In various implementations, the computing device 701 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, a digital video recorder, or a digital watch. In further implementations, the computing device 701 may be any other electronic device that processes data.

EXAMPLES

Various embodiments of 3D IC package assemblies, methods for fabricating such 3D IC package assemblies, and systems incorporating such 3D IC package assemblies are described herein. In various embodiments, a package assembly may comprise a package substrate with a plurality of build-up layers, a first die embedded in the package substrate, and a second die coupled with the first die. In various embodiments, the first die may have a first side with one or more transistors, a second side opposite to the first side, a first through silicon via (TSV), and an electrical routing feature disposed on a first portion of the second side. In various embodiments, the electrical routing feature may be electrically coupled with the one or more transistors by the first TSV.

In various embodiments, the second die may have a second TSV electrically coupled with the first TSV. In various embodiments, the package assembly may further include an adhesive layer disposed on a second portion of the second side of the first die, and the electrical routing feature may be disposed within an opening in the adhesive layer. In various embodiments, the second die may be a memory die. In various embodiments, the electrical routing feature may a TSV pad. In various embodiments, the first TSV may one of a first plurality of TSVs of the first die. In various embodiments, the second TSV may be one of a second plurality of TSVs of the second die that correspond with and are arranged in vertical alignment with the first plurality of TSVs.

In various embodiments, the second die may be one of a plurality of memory dies configured in a three-dimensional (3D) memory die stack. In various embodiments, the electrical routing feature may be a first TSV pad. In various embodiments, the second die may have a second TSV pad coupled with the second TSV. In various embodiments, the package assembly may further comprise a die interconnect coupled with the first TSV pad and the second TSV pad. In various embodiments, the package assembly may further comprise an underfill layer disposed between the first die and the second die. In various embodiments, an underfill layer may be disposed between the first die and the second die. In various embodiments, an underfill layer may be disposed within the opening in the adhesive layer. In various embodiments, a portion of the underfill layer may be disposed between the adhesive layer and the first die. In various embodiments, the package assembly may further include a layer of molding material configured to encapsulate the second die.

In various embodiments, a method may comprise providing a first die, wherein the first die has a first side with one or more transistors, a second side with an electrical routing feature, and a first through silicon via (TSV) coupled to the electrical routing feature and disposed between the first side and the second side, coupling an adhesive layer to the second side of the first die, forming one or more build-up layers on the first side of the first die, forming an opening in the adhesive layer, and coupling a second die with the second side of the first die, with the adhesive layer disposed between the first die and the second die. In various embodiments, the second die may have a second TSV, and the first TSV may be electrically coupled with the second TSV by a conductive path disposed through the opening. In various embodiments, a method may further comprise coupling the adhesive layer to a sacrificial panel prior to coupling the adhesive layer to the second side of the first die. In various embodiments, forming the opening in the adhesive layer may include forming an opening through the adhesive layer to the sacrificial panel prior to coupling the adhesive layer to the second side of the die. In various embodiments, coupling the adhesive layer to the second side of the die may include placing the second side of the die onto the adhesive layer with the electrical routing feature disposed in the opening.

In various embodiments, a method may further include forming a copper layer on the sacrificial panel and forming a cavity in the copper layer. In various embodiments, coupling the adhesive layer to the sacrificial panel may include placing the adhesive layer into the cavity prior to forming the opening through the adhesive layer to the sacrificial panel. In various embodiments, coupling the adhesive layer to the second side of the first die may include placing a portion of the adhesive layer on the electrical routing feature. In various embodiments, a method may further include placing the first die and the adhesive layer onto a sacrificial panel, with the adhesive layer disposed between the first die and the sacrificial panel, and removing the sacrificial panel from the adhesive layer after forming the one or more build-up layers on the first side of the die. In various embodiments, forming the opening in the adhesive layer may include removing the portion of the adhesive layer after removing the sacrificial panel to expose the electrical routing feature. In various embodiments, forming the opening in the adhesive layer may include exposing a portion of the adhesive layer to laser radiation. In various embodiments, exposing the portion of the adhesive layer to laser radiation may be performed by a laser projection patterning tool. In various embodiments, the laser projection patterning tool may include one or more excimer lasers.

In various embodiments, removing the portion of the adhesive layer may further include scanning the portion of the adhesive layer with an ultraviolet (UV) laser. In various embodiments, removing the portion of the adhesive layer may further include exposing the portion of the adhesive layer to laser radiation with an excimer laser. In various embodiments, removing the portion of the adhesive layer may further include exposing the portion of the adhesive layer to laser radiation by laser direct imaging. In various embodiments, removing the portion of the adhesive layer may further include exposing the portion of the adhesive layer to laser radiation by laser projection patterning. In various embodiments, the laser radiation may be UV or green laser radiation. In various embodiments, a method may further include applying a molding material over the second die and the one or more build-up layers. In various embodiments, the second die may be embedded in the molding material. In various embodiments, a method may further include applying an underfill material between the first die and the second die.

In various embodiments, a system may comprise a circuit board and a package assembly coupled with the circuit board via electrical routing features disposed on an outer surface of the package assembly. In various embodiments, the package assembly may include a substrate comprising one or more build-up layers, a first die embedded in the substrate, a second die, a die interconnect, and an electrical path. In various embodiments, the first die may have a first side with one or more transistors, a second side opposite to the first side, a first TSV, and a first electrical routing feature on the second side. In various embodiments, the first side may be electrically coupled with the first electrical routing feature by the first TSV. In various embodiments, the package assembly may further comprise an adhesive layer disposed on the second side of the first die. In various embodiments, the second die may have a second TSV and a second electrical routing feature electrically coupled with the second TSV. In various embodiments, the die interconnect may be disposed between the first electrical routing feature and the second electrical routing feature. In various embodiments, the electrical path may include the first TSV and the second TSV, and may be configured to route electrical signals between the second die and the circuit board through the one or more build-up layers.

In various embodiments, the first die may comprise a microprocessor die. In various embodiments, the first TSV may be one of a first plurality of TSVs of the first die. In various embodiments, the second die may be a plurality of memory dies arranged in a three-dimensional (3D) stack. In various embodiments, the second TSV may be one of a plurality of TSVs of the second die that correspond with and are arranged in vertical alignment with the first plurality of TSVs. In various embodiments, a system may further include an underfill material disposed between the first die and the second die. In various embodiments, a system may further include a molding compound disposed to encapsulate the second die. In various embodiments, the system may further include one or more of an antenna, a touch screen display, a touch screen controller, a battery, a global positioning system (GPS) device, a compass, a speaker, a camera, and a mass storage device.

Various embodiments may include any suitable combination of the above-described embodiments. Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
   providing a first die, wherein the first die has a first side with one or more transistors, a second side with an electrical routing feature, and a first through silicon via (TSV) coupled to the electrical routing feature and disposed between the first side and the second side;
   coupling an adhesive layer to the second side of the first die;
   forming one or more build-up layers on the first side of the first die;
   forming an opening in the adhesive layer; and
   coupling a second die with the second side of the first die, with the adhesive layer disposed between the first die and the second die, wherein the second die has a second TSV, and wherein the first TSV is electrically coupled with the second TSV by a conductive path disposed through the opening.

2. The method of claim 1, further comprising coupling the adhesive layer to a sacrificial panel prior to coupling the adhesive layer to the second side of the first die.

3. The method of claim 2, wherein forming the opening in the adhesive layer includes forming an opening through the adhesive layer to the sacrificial panel prior to coupling the adhesive layer to the second side of the die, and wherein coupling the adhesive layer to the second side of the die includes placing the second side of the die onto the adhesive layer with the electrical routing feature disposed in the opening.

4. The method of claim 3, further comprising:
   forming a copper layer on the sacrificial panel; and
   forming a cavity in the copper layer,
   wherein coupling the adhesive layer to the sacrificial panel includes placing the adhesive layer into the cavity prior to forming the opening through the adhesive layer to the sacrificial panel.

5. The method of claim 1, wherein coupling the adhesive layer to the second side of the first die includes placing a portion of the adhesive layer on the electrical routing feature, the method further comprising:
   placing the first die and the adhesive layer onto a sacrificial panel, with the adhesive layer disposed between the first die and the sacrificial panel; and
   removing the sacrificial panel from the adhesive layer after forming the one or more build-up layers on the first side of the die,
   wherein forming the opening in the adhesive layer includes removing the portion of the adhesive layer after removing the sacrificial panel to expose the electrical routing feature.

6. The method of claim 1, wherein forming the opening in the adhesive layer includes exposing a portion of the adhesive layer to laser radiation.

7. The method of claim 6, wherein exposing the portion of the adhesive layer to laser radiation is performed by a laser projection patterning tool.

8. The method of claim 6, wherein removing the portion of the adhesive layer further includes scanning the portion of the adhesive layer with an ultraviolet (UV) laser.

9. The method of claim 1, further comprising applying a molding material over the second die and the one or more build-up layers, wherein the second die is embedded in the molding material.

10. The method of claim 1, further comprising applying an underfill material between the first die and the second die.

* * * * *